(12) United States Patent
Yeung (10) Patent No.: US 8,045,402 B2
(45) Date of Patent: Oct. 25, 2011

(54) ASSISTING WRITE OPERATIONS TO DATA STORAGE CELLS

(75) Inventor: Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/458,034

(22) Filed: Jun. 29, 2009

(65) Prior Publication Data

US 2010/0329044 A1 Dec. 30, 2010

(51) Int. Cl.
*G11C 7/00* (2006.01)

(52) U.S. Cl. .................... 365/189.16; 365/154

(58) Field of Classification Search ............. 365/189.09, 365/154
See application file for complete search history.

(56) References Cited

U.S. PATENT DOCUMENTS

| | | | |
|---|---|---|---|
| 6,411,560 | B1 | 6/2002 | Tanizaki et al. |
| 6,707,702 | B1 * | 3/2004 | Komatsuzaki ............... 365/145 |
| 2002/0167849 | A1 | 11/2002 | Ohbayashi et al. |
| 2005/0088881 | A1 | 4/2005 | Miki et al. |
| 2007/0075743 | A1 * | 4/2007 | Oh ................................ 326/83 |

OTHER PUBLICATIONS

Zhang K., et al., "A 3-GHz 70 Mb SRAM in 65nm CMOS Technology with Integrated Column-Based Dynamic Power Supply", Digest of Technical Papers, ISSCC 2005/Session 26/Non-Volatile Memory/26.1, pp. 474-475 and 611, (2005).
Pilo Harold, et al., "An SRAM Design in 65-nm Technology Node Featuring Read and Write-Assist Circuits to Expand Operating Voltage", IEEE Journal of Solid-State Circuits, vol. 42, No. 4, pp. 813-819, (Apr. 4, 2007).
Pilo, Harold et al., "An SRAM Design in 65nm and 45nm Technology Nodes Featuring Read and Write-Assist Circuits to Expand Operating Voltage", 2006 Symposium on VLSI Circuits Digest of Technical Papers, 2 pages, (2006).
Ohbayashi, Shigeki et al., "A 65-nm SoC Embedded 6T-SRAM Designed for Manufacturability with Read and Write Operation Stabilizing Circuits", IEEE Journal of Solid-State Circuits, vol. 42, No. 4, pp. 820-829, (Apr. 4, 2007).
Yabuuchi, Makoto, et al., "A 45nm Low-Standby-Power Embedded SRAM with Improved Immunity Against Process and Temperature Variations", Digest of Technical Papers, ISSCC 2007/Session 18/SRAM/18.3, pp. 326-327 and 606, (2007).
Hobson, Richard F., "A New Single-Ended SRAM Cell with Write-Assist", IEEE Transactions on Very Large Scale Integration (VLSI) Systems, vol. 15, No. 2, pp. 173-181, (Feb. 2, 2007).

* cited by examiner

*Primary Examiner* — Hoai V Ho
*Assistant Examiner* — Anthan Tran
(74) *Attorney, Agent, or Firm* — Nixon & Vanderhye P.C.

(57) ABSTRACT

A data store and method of storing data is disclosed that comprises: an input for receiving a data value; at least one storage cell comprising: a feedback loop for storing the data value; an output for outputting the stored data value; the feedback loop receiving a higher voltage and a lower voltage as power supply, the data store further comprising: a voltage supply for powering the data store, the voltage supply outputting a high voltage level and a low voltage level; write assist circuitry arranged between the voltage supply and the at least one storage cell, the write assist circuitry being responsive to a pulse signal to provide a discharge path between the high voltage level and a lower voltage level and thereby generate a reduced internal voltage level from the high voltage level for a period dependent on a width of the pulse signal, the reduced internal voltage level being lower than the high voltage level, such that when powered the feedback loop receives the reduced internal voltage level as the higher voltage for a period determined by the pulse width and the high voltage level at other times; and pulse signal generation circuitry for generating said pulse signal.

20 Claims, 11 Drawing Sheets

ASSISTING WRITE OPERATIONS TO DATA STORAGE CELLS

TECHNICAL FIELD

The technical field relates to data storage devices and methods of operating such devices, and in particular to techniques that can be employed when performing data store access operations to assist those access operations.

BACKGROUND

There is an increasing demand for data storage devices to be constructed which are smaller and consume less power than their predecessor designs, whilst retaining high performance. New technologies are being developed which allow a reduction in size of the individual transistors making up each storage cell. However, as the storage cells decrease in size, the variation in behaviour between individual storage cells tends to increase, and this can adversely affect predictability of operation. This variation in operation of the individual storage cells can give rise to significant failure rates when trying to run the storage devices at high speed to meet the performance requirements. It is often also the case that there is a desire to use a lower power supply voltage for the storage device in order to reduce power consumption, but this can further increase the likelihood of failed operation within individual storage cells. Accordingly, in modern technologies, it is becoming more and more difficult to produce data storage devices such as memory devices where the individual cells have the required stability to ensure effective retention of data (stability sometimes being measured in terms of static noise margin (SNM)), whilst also having required write-ability (WM) to ensure that new data values can be stored in the cells within the time period allowed for a write operation.

Faced with these issues, various assistance mechanisms have been developed which seek to assist individual memory cells in operating correctly when write and read operations are performed on those cells. For example, the article "A 3-GHz 70 Mb SRAM in 65 nm CMOS Technology with Integrated Column-Based Dynamic Power Supply" by K Zhang et al, Intel, published in ISSCC 2005, Session 26, describes a six transistor SRAM cell (often referred to as a 6T SRAM cell) which is stable in all conditions, but requires write assist (WA) circuitry to improve the likelihood of individual cells operating correctly when written to. The write assist circuitry disclosed in this article is illustrated schematically in FIG. 1, and is based on the idea of lowering the supply voltage to an addressed memory cell just prior to the write operation, the lower supply voltage lowering the stability of the memory cell, and therefore making it more easy to write into.

Figure 1:
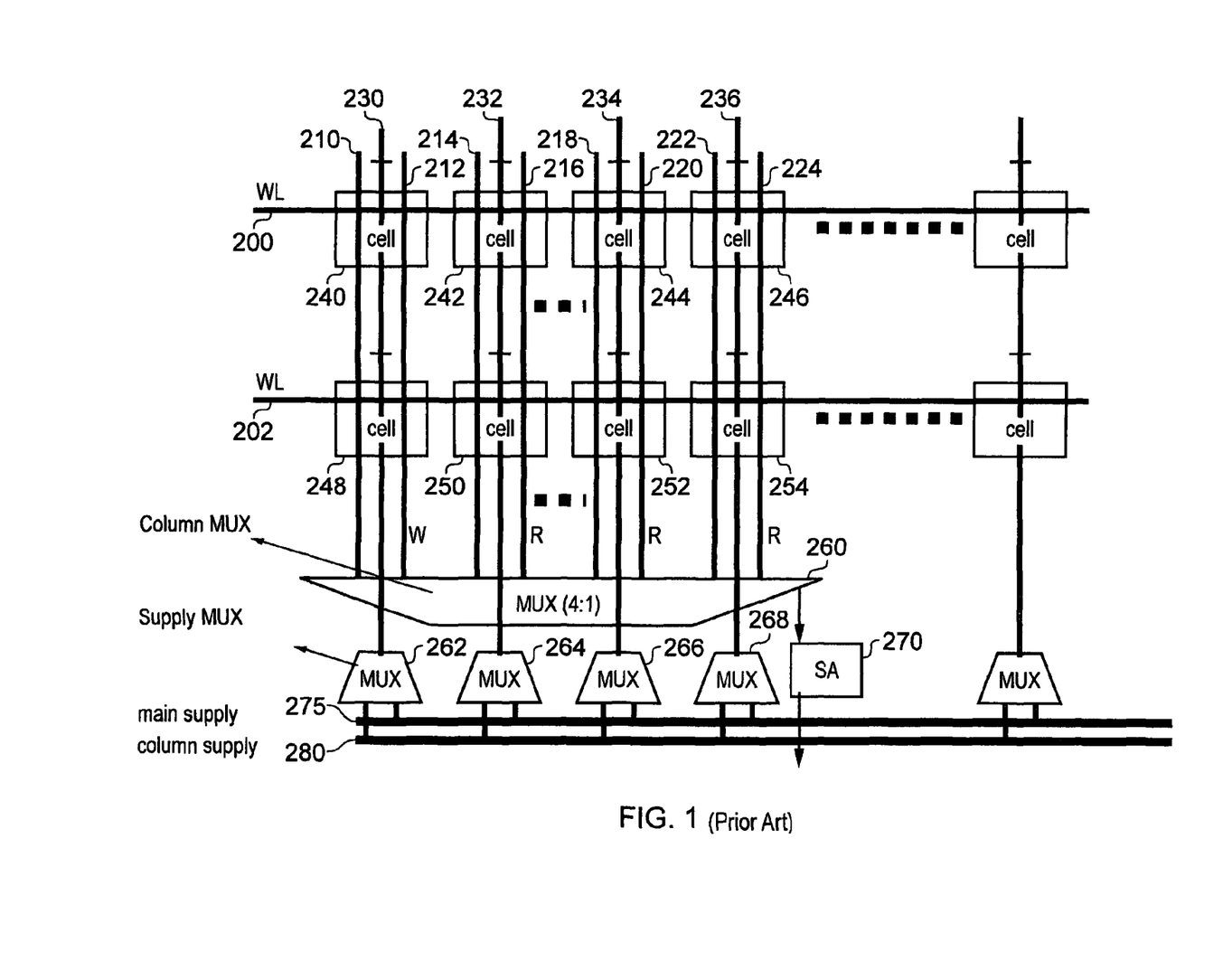
FIG. 1 shows an array of memory cells according to the prior art.

FIG. 1 shows an array of memory cells 240, 242, 244, 246, 248, 250, 252, 254 provided in association with a particular column multiplexer 260 of the memory array. Each row is addressed by a word line 200, 202, and each column has a power supply voltage provided by a supply voltage line 230, 232, 234, 236. As is known in the art, each of the columns also has a pair of bit lines 210, 212, 214, 216, 218, 220, 222, 224 associated therewith. From an address provided to the memory device, a row and column within the memory device is identified, with the addressed memory cell being the memory cell at the intersection between the identified row and column. For a read operation, the word line 200, 202 associated with the selected row is selected in order to enable a row of cells, and then the column multiplexer 260 outputs to the sense amplifier 270 an indication of the voltages on the pair of bit lines associated with the selected column to allow the sense amplifier to detect the value stored in the addressed memory cell. For a write operation, the word line is enabled in the same manner, and the voltage on one of the pair of bit lines associated with the selected column is then discharged to identify the data value to be stored in the addressed memory cell. In this design multiplexers are provided which can select between a main supply voltage and a specially generated lower column supply voltage provided. Just prior to the write operation, the relevant multiplexer associated with the selected column is driven to select, as the voltage output on the supply voltage line for that column, the reduced column supply voltage.

A problem with the above design is that it requires a dedicated voltage generator to produce the extra reduced column supply, and this either needs to be accommodated within the design of the memory device, or else be provided externally, with additional metal lines being provided to route the voltage supply from that voltage generator. For any change in height or width of the memory device, the capacitances observed on the various column supply voltage lines will change, and this will typically require a redesign or tuning of the voltage generator used to generate the extra column supply voltage, to ensure that the voltage on the column supply voltage line can be reduced sufficiently quickly in the short period of time allowed before the write occurs to the addressed memory cell. Such voltage generators will also be susceptible to temperature and voltage variations, which may require correcting circuits to be added.

In addition to these problems, in memory devices designed for low power applications, the presence of the additional voltage generator leads to significant power consumption since the additional voltage supply must be maintained at all times to enable that supply voltage to be available ahead of any write operation.

Figure 2:
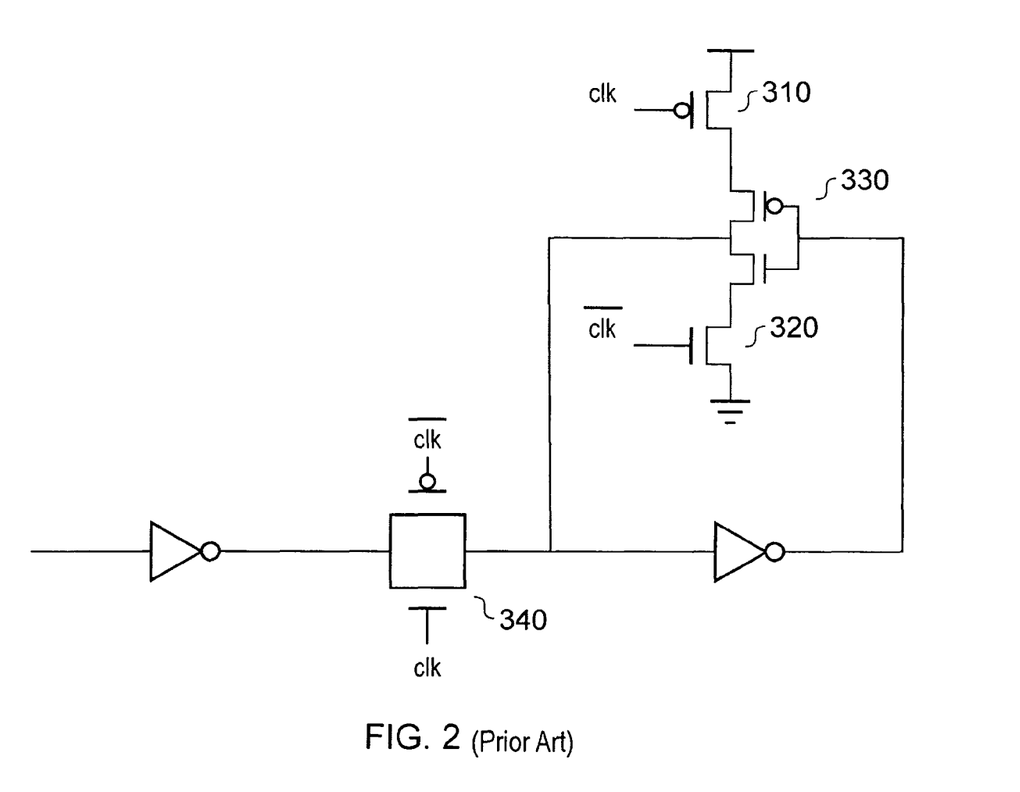
FIG. 2 shows a standard latch cell according to the prior art.

Other types of storage cells that also have difficulty switching state are standard latch cells comprising inverters arranged in a feedback loop. FIG. 2 shows an example of such a cell of the prior art, this cell comprising a device for allowing the latch to be consistently written to. This device comprises transistors 310 and 320 which receive the same clock signal as the transmission gate 340, thus when the transmission gate is enabled and the storage latch is open and can receive a value, the inverter 330 is powered down, such that a value can be written to the feedback loop. When the transmission gate is closed, the inverter 330 is powered and the feedback loop stores the value. A disadvantage of this mechanism is that it adds two additional transistors for each storage cell.

It would be desirable to be able to provide a mechanism for enabling a storage cell to be written to consistently without adding too much additional circuitry and without unduly affecting the stability of other neighbouring storage cells.

SUMMARY

A first aspect of the technology described in this application provides a data store comprising: an input for receiving a data value; at least one storage cell comprising: a feedback loop for storing said data value; an output for outputting said stored data value; said feedback loop receiving a higher voltage and a lower voltage as power supply, said data store further comprising: a voltage supply for powering said data store, said voltage supply outputting a high voltage level and a low voltage level; write assist circuitry arranged between said voltage supply and said at least one storage cell, said write assist circuitry being responsive to a pulse signal to provide a discharge path between said high voltage level and a lower voltage level to generate a reduced internal voltage level from said high voltage level for a period dependent on a width of said pulse signal, said reduced internal voltage level being lower than said high voltage level, such that when powered said feedback loop receives said reduced internal voltage level as said higher voltage for said period signal generation circuitry for generating said pulse signal.

The inventors recognised the conflicting problems of stably storing data and yet allowing that data to be overwritten with a new value. The technology described in this application addresses this problem by controlling the powering of the feedback loop that stores the data using a pulse signal so that when data needs to be written to the cell the voltage powering the feedback loop can be reduced temporarily in response to the pulse and yet during normal storage the cell is powered in the usual way and can retain data. Reducing a voltage level in a controlled manner in this way is not always straightforward. In particular, voltage supplies to a system are expensive and require metallised tracks. Thus, the technology described in this application generates its own reduced internal voltage level from the higher voltage level that generally supplies the circuit, thereby obviating the need for an additional external supply.

Furthermore, this reduced voltage level is generated by providing a discharge path between said high voltage level and a lower voltage level, and this allows charge held by the capacitance of the circuit to be discharged, which allows the high voltage level to fall quickly which increases the speed of the circuit.

Thus, a system where the voltage level drop can be controlled is provided. This is important as the performance of the circuits is dependent on the speed that they can be clocked and if the voltage level cannot be reduced fast then the data value may not be written in the required time.

In some embodiments, said write assist circuitry comprises a plurality of transistors arranged in series between said high voltage level and said low voltage level, said feedback loop receiving said higher voltage from a node between said plurality of transistors, said pulse generation circuitry being configured to supply said pulse signal to at least one gate of said plurality of transistors, such that in response to said pulse signal said corresponding at least one transistor changes state and said reduced internal voltage is output at said node and in response to no pulse signal substantially said high voltage level is output at said node.

One way of generating the reduced internal voltage level is to use a plurality of transistors arranged in series between the high voltage level and the low voltage level output by the voltage supply. By turning the transistors on or off in a controlled manner a reduced internal voltage can be generated in a controlled and reproducible manner, and a discharge path for discharging charge held by the capacitance of the circuit is also provided.

Although, a skilled person would understand that the reduced internal voltage level could be generated in a number of ways, one area efficient and simple manner of doing it is if the write assist circuitry comprises a PMOS and NMOS transistor arranged in series between said high voltage supply and said low voltage supply, said feedback loop receiving said higher voltage from a node between said PMOS and NMOS transistors, said pulse generation circuitry being configured to supply said pulse signal to gates of said transistors, said PMOS transistor turning off and said NMOS transistor turning on in response to said pulse such that said higher voltage supplied to said feedback loops falls while said pulse is supplied to said gates.

Although the storage cell can comprise a number of things, in some embodiments it comprises a standard latch, comprising a transmission gate and said feedback loop. In some embodiments the feedback loop comprises cross coupled inverters.

In other embodiments, said at least one storage cell comprises a six transistor bit cell such as are used in SRAM memories.

In some embodiments, said pulse generation circuitry is configured to be programmable such that said width of said pulse can be varied in response to an input.

The width of the pulse determines how long the voltage level is reduced for and also how low it falls and this is important as it determines the period during which the cell is relatively unstable and its degree of instability. An unstable storage cell is easy to write to, but if other cells that are not being written to are also affected by this write assist circuitry then they are more liable to loose their stored data than they would be were they fully powered. Thus, the selection of the width of the pulse is important as it can affect both cell stability and the ability to write to the cell. Being able to program the width of the pulse can be extremely advantageous as it enables the data storage cells to be optimised or at least improved in dependence on current conditions, so that data is not or at least is very rarely lost and yet writes are generally successful.

In some embodiments, said pulse generation circuitry comprises an external input for receiving a signal indicative of said width of said pulse from a user.

The width of the pulse can be determined in a number of ways, it can be programmable or it can be set in response to a user input. This user input may actually indicate the width of the pulse required or it may indicate other parameters that the pulse generation circuitry can use when calculating a desirable width of the pulse.

In some embodiments, said pulse generation circuitry is configured to generate said width of said pulse in response to a plurality of predetermined conditions.

As noted previously the desired width of the pulse may change depending on different conditions and as such, it may be advantageous to have the pulse generation circuitry configured to generate different widths depending on the different conditions. These conditions may be input to the circuitry or the circuitry may detect them.

In some embodiments, said plurality of predetermined conditions comprise at least one of a loading of said data store, characteristics of said write assist circuitry and a required minimum higher voltage level.

The different conditions can comprise a number of things for example the loading of the data store will affect how long and how low the high voltage level should be pulled down for and to. Furthermore, characteristics of the write assist circuitry such as its sizing also affects how much and how quickly it can pull a voltage level down and as such, will affect the pulse width required. Another condition that may affect the width of the pulse may be the minimum higher voltage level that is allowed by the circuitry and the required yield of the storage cell, i.e. how successfully it responds to the data value written and how liable it is to lose data storage.

In some embodiments, said write assist circuitry comprises a feedback loop such that in response to said reduced internal voltage level reaching a predetermined value said write assist circuitry does not reduce said voltage level further.

It may be advantageous if the write assist circuitry is set to limit the reduced internal voltage level that it pulls the higher voltage level down to, this can be important where the write assist circuitry affects not only cells being written to but other cells too. This can be done by providing the circuitry with a feedback loop that limits the reduction of the higher voltage level to a predetermined value.

In some embodiments, said pulse generation circuitry is responsive to receipt of a write request to write said data value to said data store, to generate said pulse.

The pulse may be generated in response to a number of signals indicating that a write is to occur. For example, the pulse may be generated in response to a write request signal.

In some embodiments, said data store comprises a plurality of said storage cells arranged in an array.

In some embodiments, said data store comprises a plurality of said storage cells arranged in an array and a plurality of write assist circuitry, one for each column of said array, said data store comprising an SRAM memory.

SRAM memories are widely used to store data and each column in the array of the SRAM memory has its storage cell powered a same voltage supply. Thus, in example embodiments the write assist circuitry is arranged to adjust the voltage of all storage cells in a column of the array, the column selected being the column that the cell being written to lies in. This allows this cell to be written to but affects the stability of the other cells in the column.

In some embodiments, said SRAM comprises a dual port SRAM configured to receive two access requests during a same clock cycle, said data store comprising word line pulse generation circuitry for generating a word line pulse to activate a row of storage cells in said array in response to receipt of one of said access requests, said word line pulse generation circuitry and said pulse signal generation circuitry being configured such that said pulse generated by said pulse signal generation circuitry is narrower than said word line pulse.

Dual port SRAM memories are memories where two storage cells within a column can be active simultaneously. If both of these cells are being written to this is not a problem, however it is possible for one cell to be written to while the other cell is being read. In such an event the storage cell that is being read may become unstable when the voltage level powering the cell is reduced. These cells are accessed by a word line pulse that turns the pass gates on. During the read operation the internal node of the read bit cell will start to become unstable as the voltage level of the high voltage level powering the cell is lowered. However, during this time the stored state is developed onto the bit lines of the column and as long as the word line pulse width is longer than the pulse width of the update circuitry a write back operation will force the storage cell back to its original state.

In some embodiments, said word line generation circuitry is configured to generate said word line pulse before said pulse generation circuitry generates said pulse.

Generating the word line pulse before the pulse generating circuitry generates its pulse means that the read can be activated before the voltage level is reduced which means that the potential speed degradation which might occur during the read operation if this voltage level is reduced can be avoided or at least reduced.

In some embodiments, the data store comprises a plurality of said storage cells arranged in a plurality of blocks and a plurality of write assist circuitry one for each block.

In other embodiments, the data store comprises a plurality of said storage cells arranged in a plurality of rows and a plurality of write assist circuitry one for each row.

The write assist circuitry can be used to control the storage cells in rows if it is likely that a row of storage cells will be written to a same time, or it can be used to control them in blocks if it is likely that a block will be written to at any one time.

A second aspect of the technology described in this application provides a method of storing data comprising the steps of: powering a feedback loop for storing said data value in at least one storage cell with a higher voltage and a lower voltage; receiving a data value; generating a pulse signal; in response to said pulse signal providing a discharge path between said high voltage level and a lower voltage level and thereby generating a reduced internal voltage level from a high voltage level supplied from a power supply for a period dependent on a width of said pulse signal, said reduced internal voltage level being lower than said high voltage level, such that when powered said feedback loop receives said reduced internal voltage level as said higher voltage for said period determined by said pulse width and said high voltage level at other times; and storing said received data value in said storage cell during said pulse period.

A third aspect of the technology described in this application provides a means for storing data comprising: an input means for receiving a data value; at least one storage means comprising: a feedback loop for storing said data value; an output means for outputting said stored data value; said feedback loop receiving a higher voltage and a lower voltage as power supply, said data store further comprising: a voltage supply means for powering said data store, said voltage supply outputting a high voltage level and a lower voltage level; write assist means arranged between said voltage supply means and said at least one storage means, said write assist means being responsive to a pulse signal to provide a discharge path between said high voltage level and a lower voltage level and thereby generate a reduced internal voltage level from said high voltage level for a period dependent on a width of said pulse signal, said reduced internal voltage level being lower than said high voltage level, such that when powered said feedback loop receives said reduced internal voltage of level as said higher voltage for said period determined by said pulse width and said high voltage level at other times; and pulse signal generation means for generating said pulse signal.

The above, and other objects, features and advantages will be apparent from the following detailed description of illustrative, non-limiting, and example embodiments which is to be read in connection with the accompanying drawings.

DETAILED DESCRIPTION

Figure 3A:
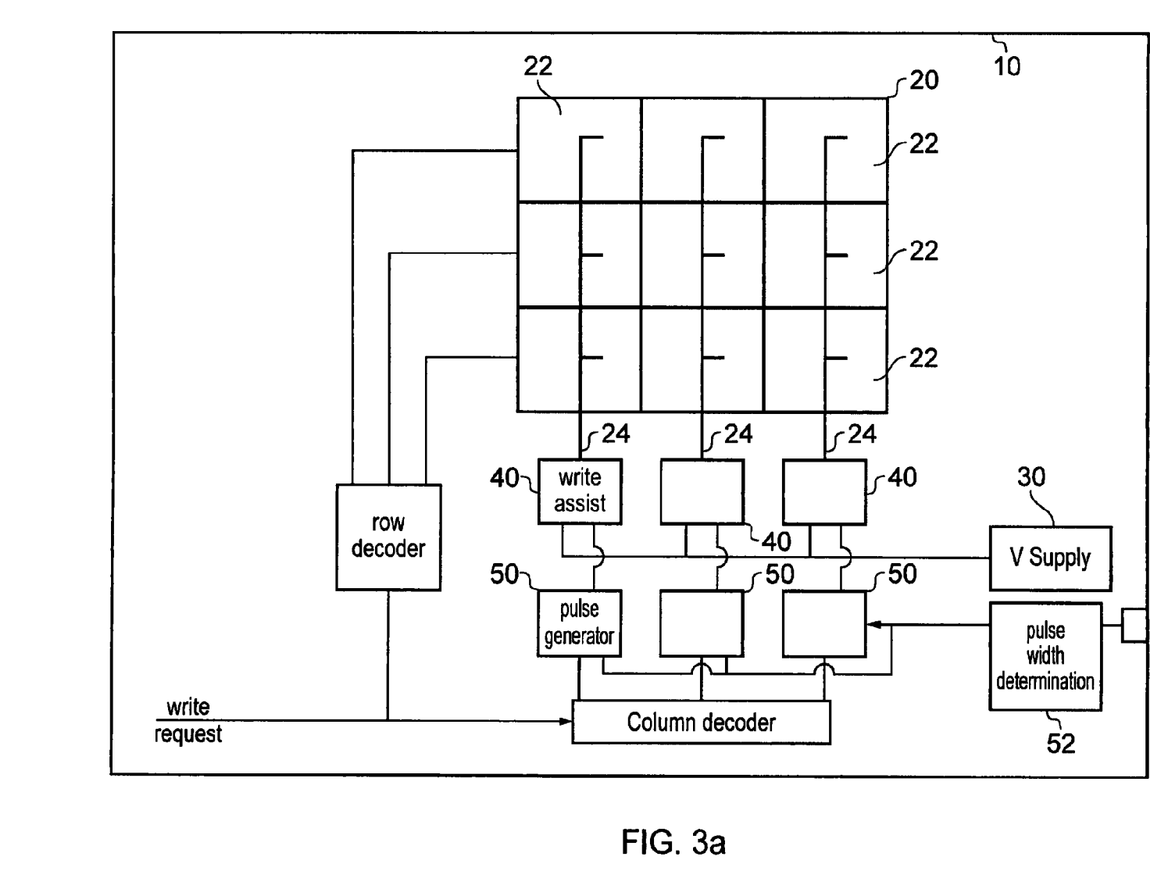
FIG. 3a shows a data store according to an example embodiment.

FIG. 3a shows a data store 10 having an array 20 of storage cells 22. These storage cells are powered by voltage supply lines 24 which are fed from voltage supply 30 via write assist circuitry 40. Write assist circuitry 40 receives a pulse from pulse generation circuitry 50 in response to a write request to the column that the write assist circuitry 40 is controlling. Thus, a write request is received, it is decoded to determine the row and the column that it is writing to and the decoder circuit sends a signal to that column and in response to receiving the signal, pulse generation circuitry 50 generates a pulse. This is transmitted to write assist circuitry 40 for that column. In response to this pulse the write assist circuitry 40 reduces the level of voltage that it outputs to that column of storage cells. Thus, when the actual write request arrives on the row, the cell in the column corresponding to the pulsed write assist circuitry has a reduced voltage level powering it and this facilitates the overwriting of the data value that is stored in that storage cell.

In this way, the voltage supply to the feedback loop of each storage cell in the column is reduced for a period of time determined by the pulse generated by pulse generator 50. This pulse width is determined by pulse width determination circuitry 52. Pulse width determination circuitry may receive input data from a user indicating a desired pulse width or it may monitor conditions and performance of the array and determine a desired pulse width in dependence upon these variables. The width of the pulse is selected so that the voltage level of the cell is reduced for a time that is sufficient for the data value to be written to that storage cell, while still being short enough to avoid other storage cells in the column becoming unstable. This may be a particular problem for a multi-ported storage array where a value may also be read from the column whose voltage has been reduced.

It should be noted that although in this embodiment a pulse generation circuit 50 is shown for each column, in some embodiments, there may simply be a single pulse generation circuit that transmits a pulse to the appropriate column in dependence upon information from the column decoder. In other embodiments the pulse generation circuitry may actually be formed within the column decoder.

Figure 3B:
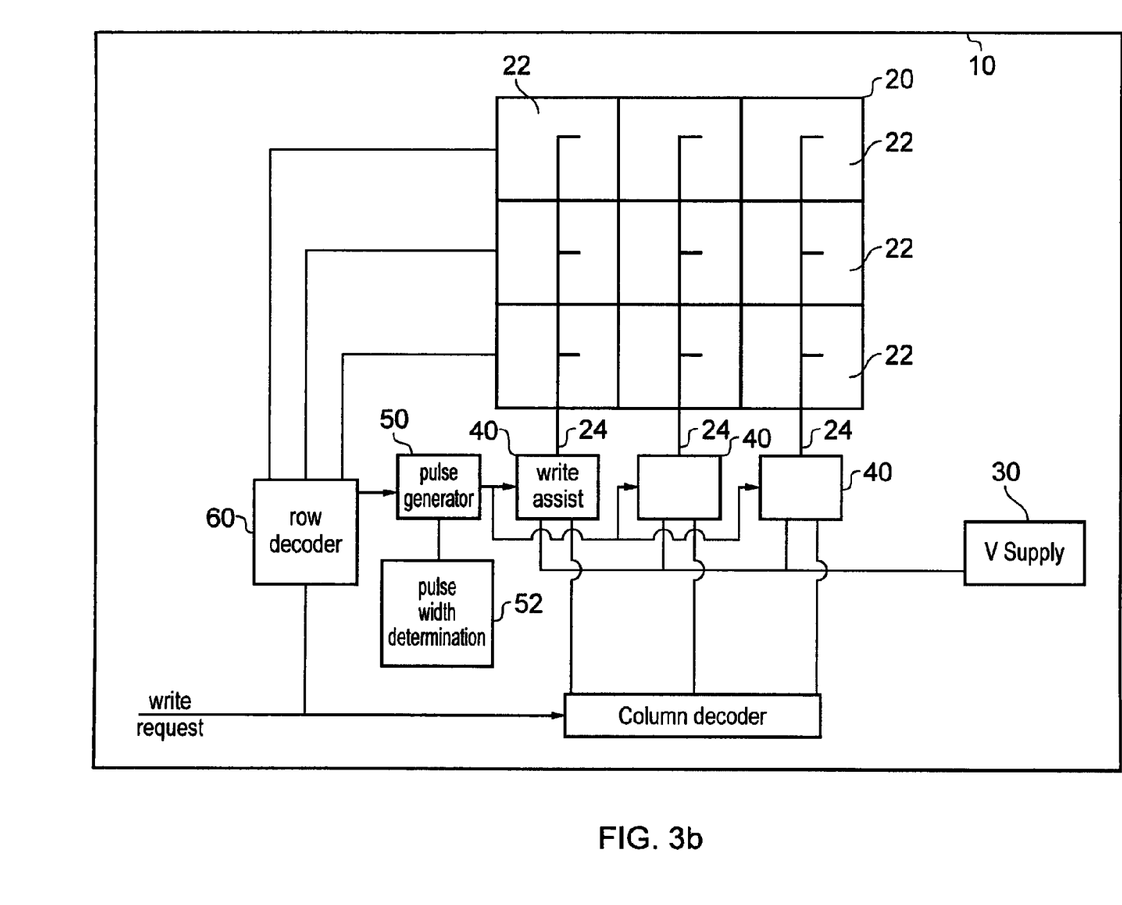
FIG. 3b shows a data store similar to that of FIG. 3a but with alternative pulse generation circuitry according to another example embodiment.

FIG. 3b shows an alternative embodiment where the pulse generation circuitry 50 is linked to row decoder 60. In this embodiment the pulse generation circuitry generates a pulse in response to the row decoder indicating that a write request has been received and is being processed. It transmits the pulse to each of the write assist circuitry 40, and the column decoder activates the write assist circuitry of the decoded column. Thus, only the write assist circuitry 40 of the addressed column is activated and this write assist circuitry 40 reduces the voltage supplied to that column of storage cells for a time determined by the width of the pulse received.

It should be noted that although the pulse generation circuitry 50 is shown as being separate from row decoder 60 in this embodiment, in other embodiments it may be formed within the row decoder.

Figure 4A:
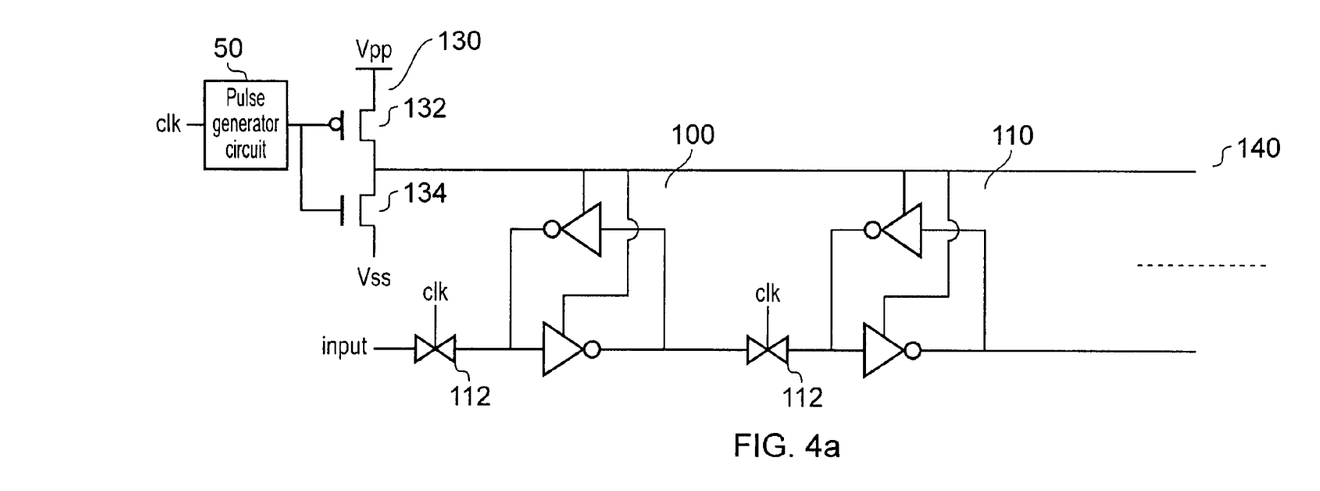
FIG. 4a shows a row of storage latches according to an example embodiment.

FIG. 4a shows in schematic form a row of storage latches according to an example embodiment. This row includes storage latch 100 and storage latch 110 and further storage latches now shown. These latches 100, 110 are formed from two cross-coupled inverters that are separated by transmission gates 112 that control the input of the data values to the inverter loops where they are stored. The transmission gates 112 are clocked by clock signal clk, and in response to the clock signal going high the transmission gate opens and allows data to be input to the latch 100. The row of latches also comprises write assist circuit 130. Write assist circuitry 130 receives a pulse from pulse generation circuitry 50 triggered by the clock signal clk that is the same clock signal received by the transmission gates 112.

Write assist circuitry 130 is formed from a pmos transistor 132 and an nmol transistor 134 arranged between a high and low voltage supply VDD and VSS. It has an output between the two transistors that supplies power to a voltage supply rail 140. The voltage supply rail 140 supplies a high voltage level to the inverters in the cross coupled inverters of the latches 100, 110. When there is no pulse supplied from pulse generation circuitry 50, there is a low signal at the input to the transistors 130, 132 and transistor 132 is turned on and transistor 134 is off. The voltage supplied to the voltage supply line 140 of the latches 100, 110, is therefore at the high voltage supply level VDD.

In response to the clock signal clk going high a pulse is generated by pulse generation circuitry 50 and in response to this pulse, transistor 132 turns off while transistor 134 turns on and thus, the voltage output from write assist circuitry 130 to voltage supply line 140 is pulled down by the discharge path through transistor 134 and falls rapidly. Thus, during the length of the pulse the voltage level powering the inverters is reduced and the feedback loop is no longer stable and data values can be written to the latches. In this way a single write assist circuit 130 can be provided to allow a whole row of latches to be written to. This is a significant gate saving over the prior art. It should be noted that in other embodiments, the latches could be arranged in blocks with a single write assist circuit controlling a whole block of latches.

Figure 4B:
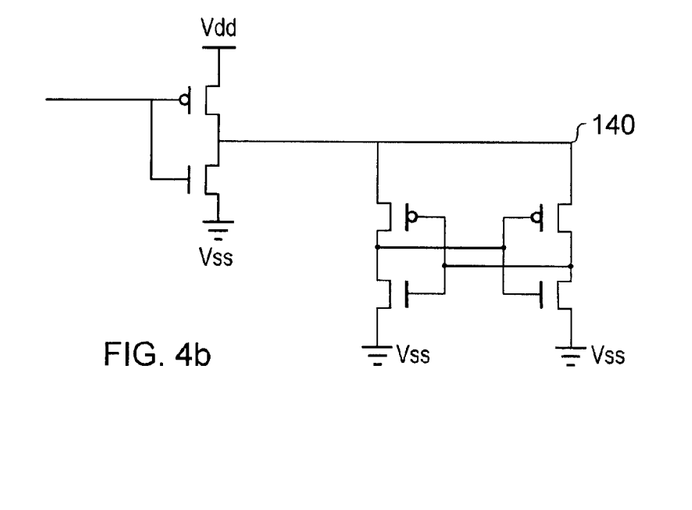
FIG. 4b shows one of the storage latches of FIG. 4a in transistor form.

FIG. 4b shows one of the latches 100, 110 in transistor form. Viewing them in transistor form makes it clear how reducing the voltage level of voltage supply line 140 renders the cross coupled loops unstable and allows a new value to be written.

Figure 5:
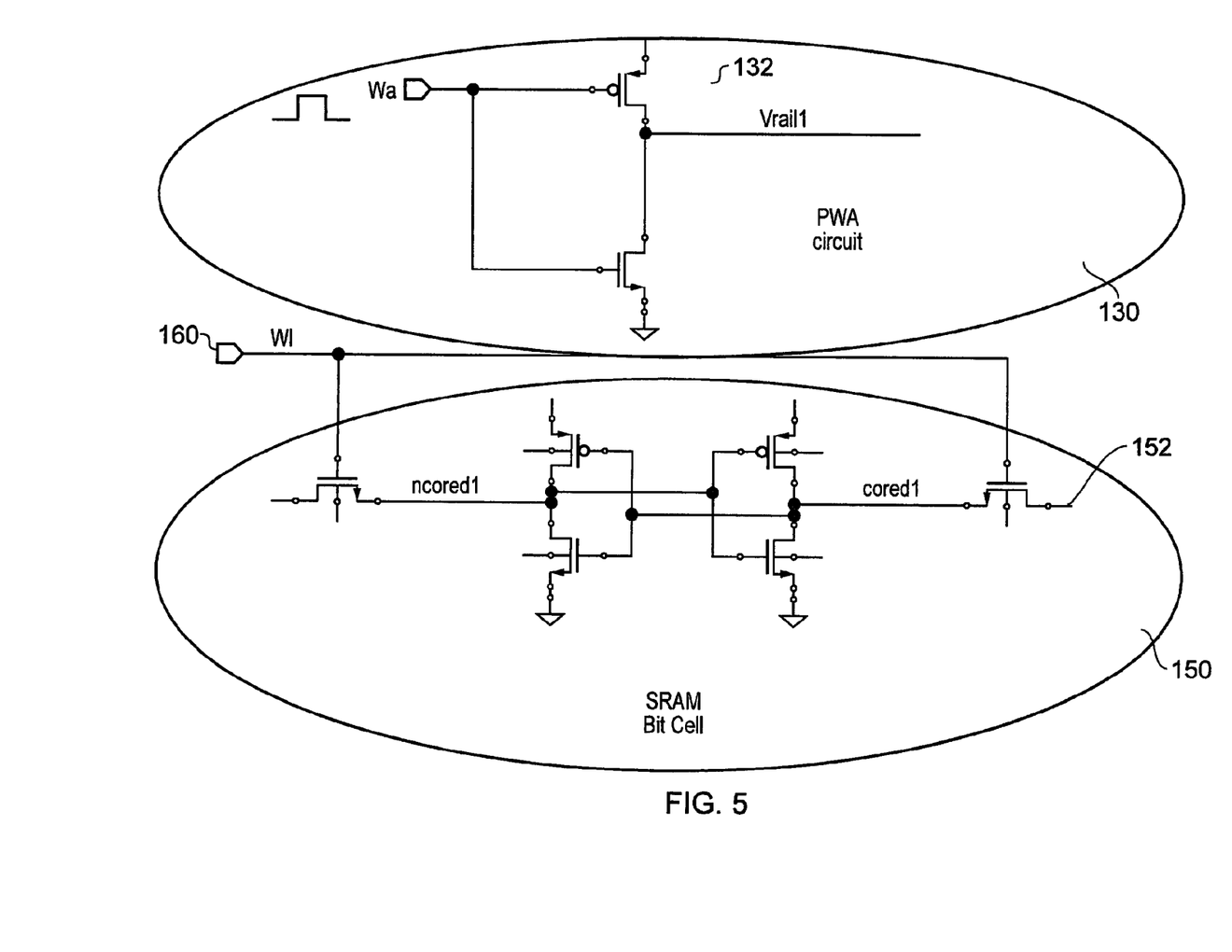
FIG. 5 shows write assist circuitry and a corresponding SRAM bit cell that it powers.

FIG. 5 shows an SRAM bit cell 150 which is a conventional six transistor cell having a cross-coupled inverter feedback loop with two pass gates on either side and write assist circuitry 130 which is used to provide the supply voltage to the feedback loop of SRAM bit cell 150. This cell may be one of the storage cells 22 of the array 20 of FIG. 3.

Thus, similarly to the standard latch example of FIG. 4 in response to a pulse on the write assist input wa the supply voltage to the cell is pulled down towards VSS for the period of the pulse and this enables a signal on the word line 160 to cause the bit cell to switch state if required and allows a new value to be stored therein.

Thus, in such an SRAM each column will have write assist circuitry 130 and during retention and read the signal pin wa of the write assist circuitry will be de-asserted and therefore, the PMOS header transistor 132 will be turned on providing substantially the full VDD supply to the bit cell columns. During a write operation a pulse is received on the signal pin wa. The timing of this pulse can be varied in dependence upon various conditions such as the loading of the bit cell column, the sizing of the write assist circuitry 132 and the yield/minimum supply voltage that is allowed. By pulsing the write assist signal, the virtual rail to the bit cell and column starts to collapse for the period of the pulse and this collapse can be controlled by the width of the pulse.

Figure 6:
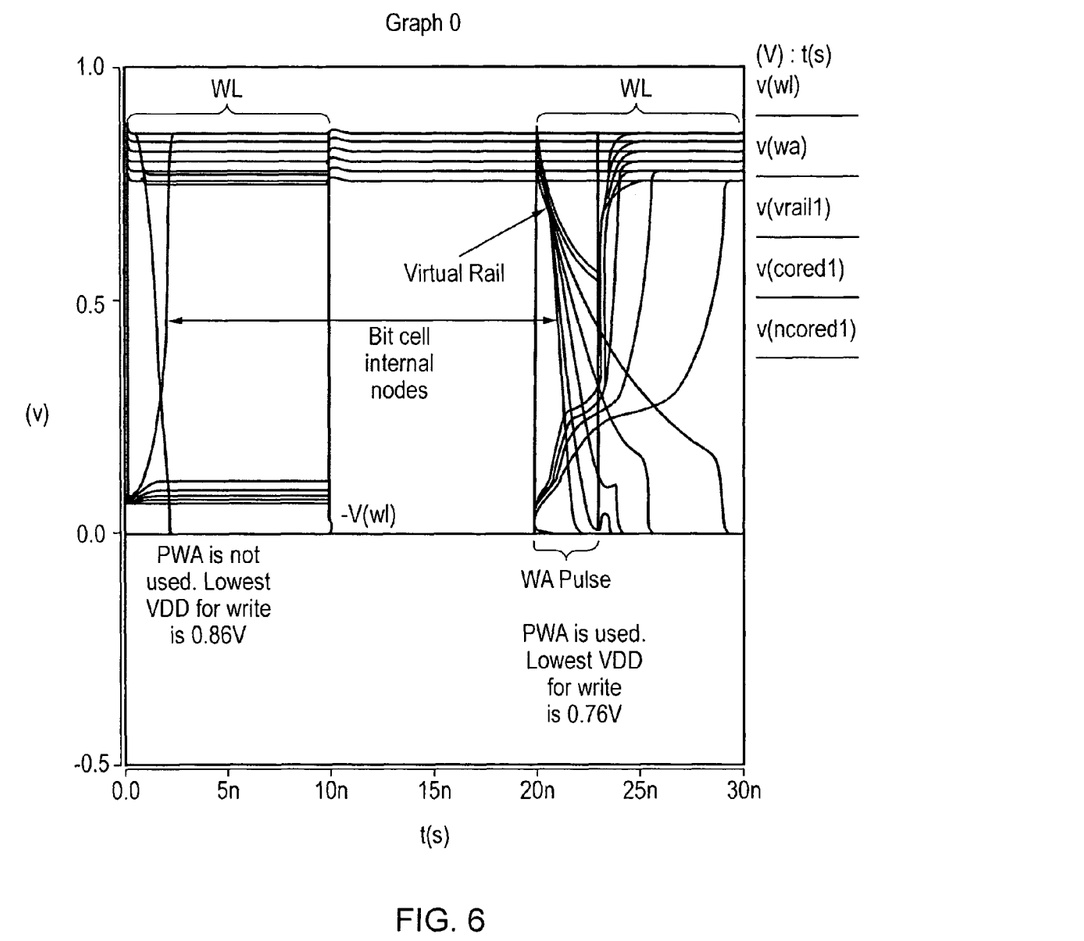
FIG. 6 shows a timing diagram showing voltage levels of different portions of the six bit cells such as those shown in FIG. 5.

FIG. 6 shows a timing diagram showing a simulation of a pulse write assist operation with different VDD levels. This simulation uses the worst case bit cell (least writable) the worst case temperature)(−40° and the worst case global distribution (slow n, fast p). In this diagram the write assist signal is pulsed at WA pulse and the virtual rail falls during this pulse. Thus, the VDD during write is reduced due to this pulse, making the storage cell less stable and easier to write to. The amount that the virtual rail falls in this embodiment depends on the width of the pulse. The internal nodes coredl and ncored 1 fall in response to the drop on the virtual rail.

In the embodiments of FIGS. 4 and 5, the amount that the write assist circuitry pulls the voltage supply down depends on the width of the pulse. However, the width of the pulse also determines the length of time that the cell is available to be written and also the length of time that other cells are in a less stable state. Thus, it may be advantageous to control the amount that the power rail is pulled down independently to the pulse width.

Figure 7:
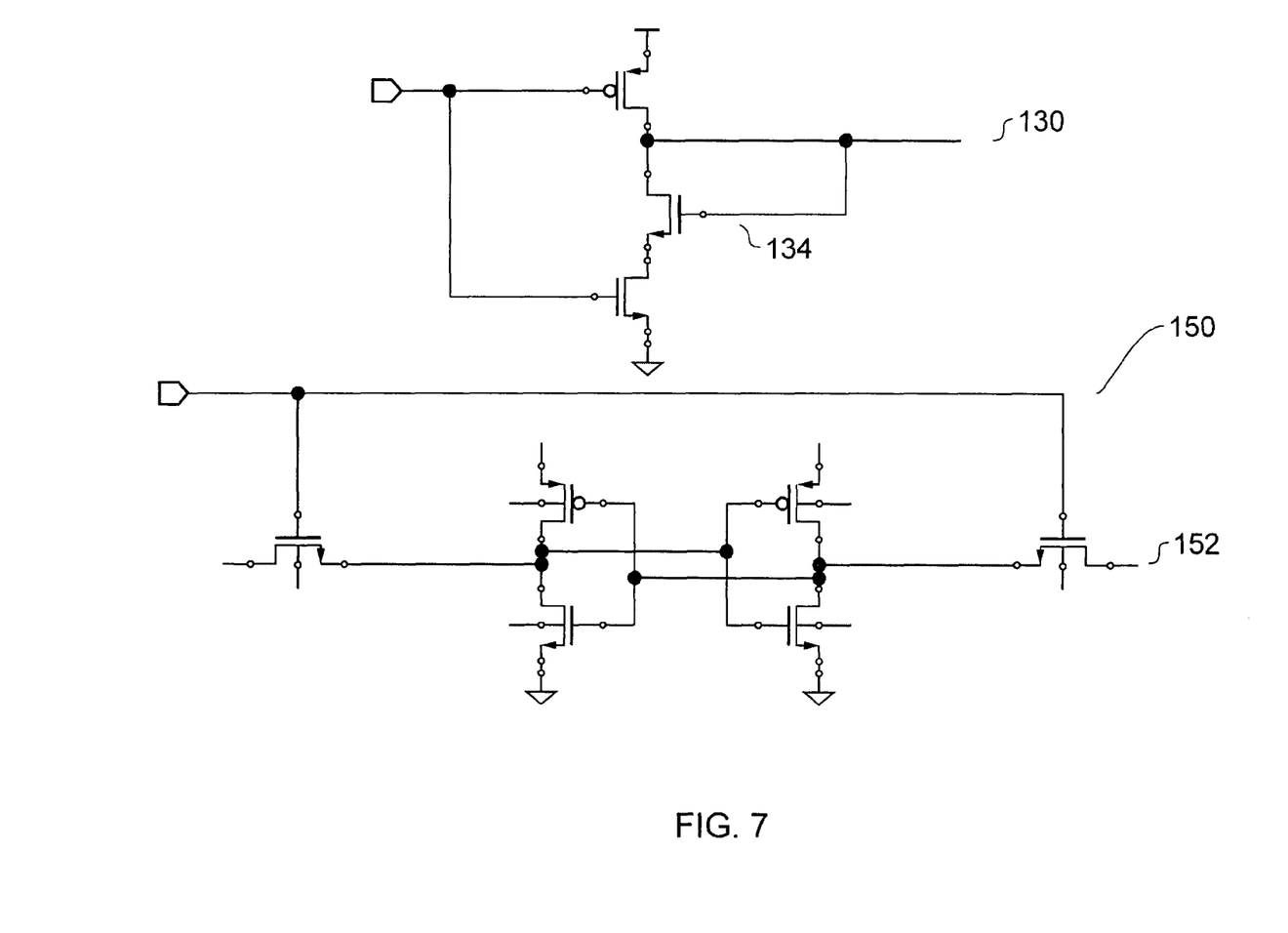
FIG. 7 shows write assist circuitry with a feedback loop for limiting a voltage reduction level.

FIG. 7 shows write assist circuitry where this independent control is provided. In this embodiment a feedback loop is provided in write assist circuitry 130 which when the output voltage reaches a certain level turns transistor 134 off thereby stopping the output voltage from being pulled down any further.

Figure 8:
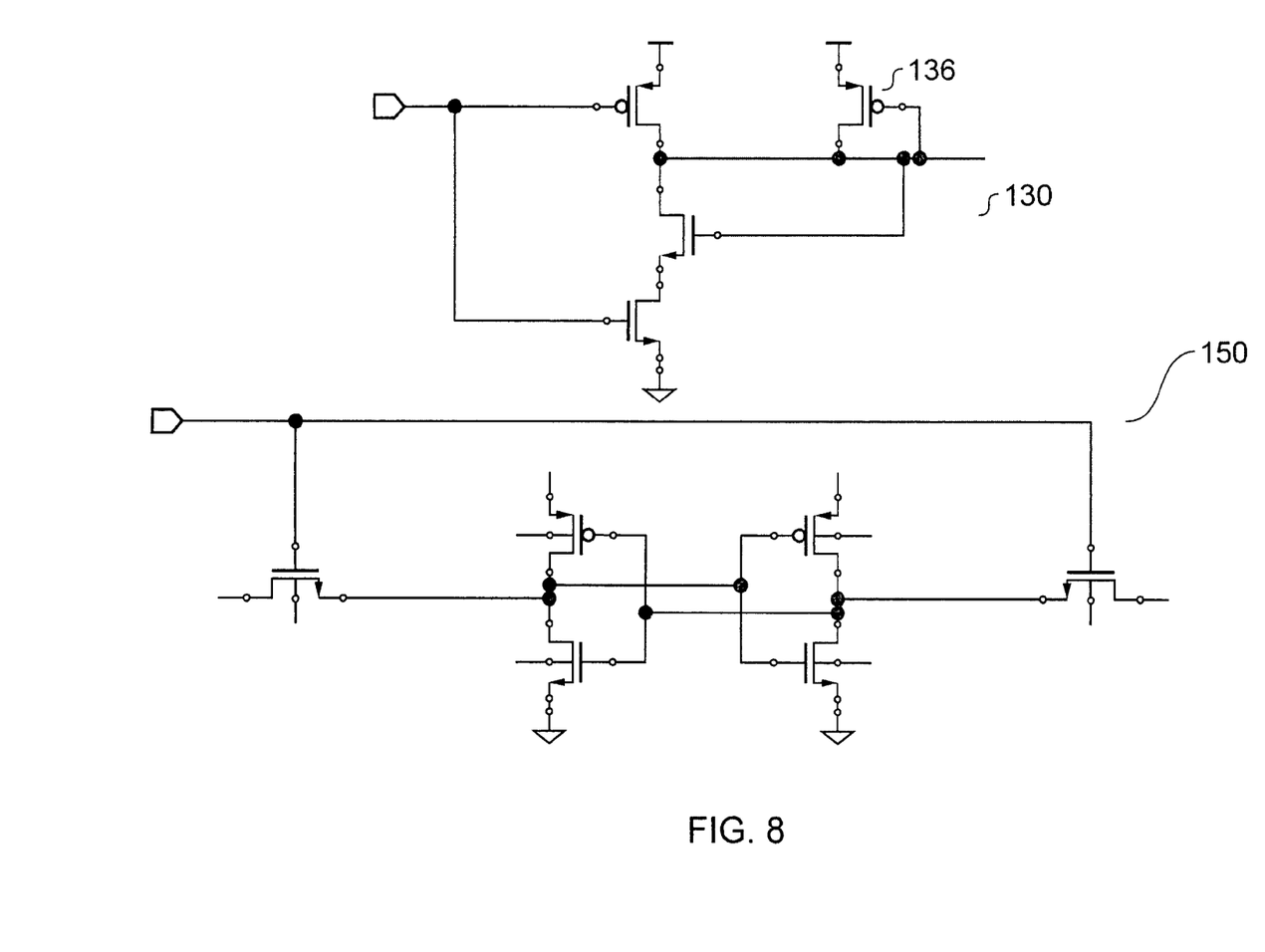
FIG. 8 shows an alternative embodiment of the write assist circuitry of FIG. 7.

FIG. 8 shows a slightly more complex version of such a circuit, that is an alternative circuit to the circuit of FIG. 7. The inclusion of the PMOS device 136 in FIG. 8 provides an alternative means of controlling the voltage droop.

As discussed previously it may be important to control the drop of the voltage supply to the feedback loop to ensure the bit cells that are experiencing this and yet are not being written to are stable. The main reason for the write assist signal to be pulsed is to limit how far (for circuits such as those shown in FIG. 5) and for how long the virtual rail collapses. For a single port memory during a write operation only one bit cell of a column will be active. That is the access devices (pass gates) will be turned on. The active bit cell is the bit cell to be written into. All other bit cells within the column will be in retention mode. Bit cells in retention mode can retain state at a lower VDD and thus, will not become unstable in response to the falling virtual rail. However, a problem may arise for dual port memories.

Figure 9:
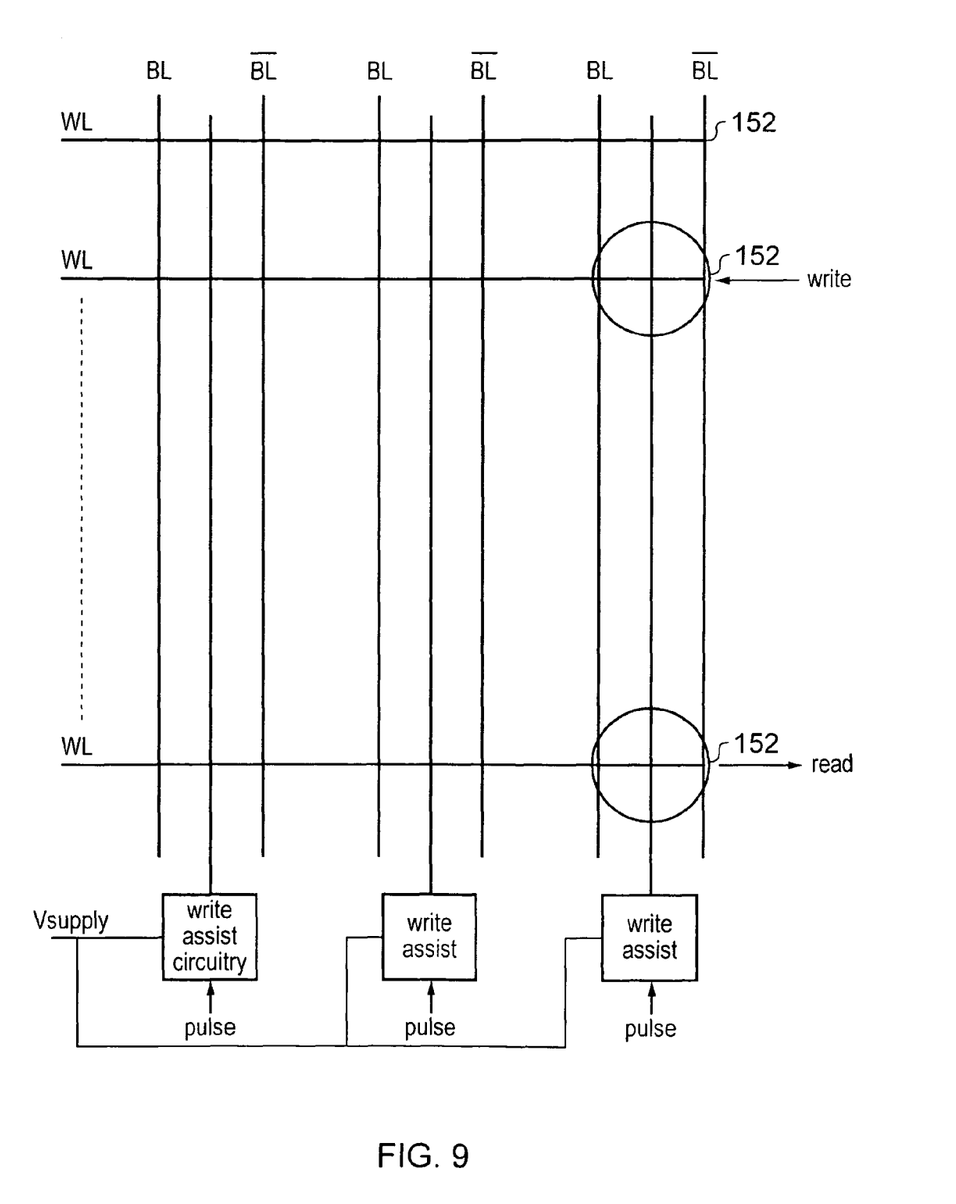
FIG. 9 shows in schematic form a SRAM memory array according to an example embodiment.

FIG. 9 shows a dual port SRAM cell memory in schematic form. In devices such as this, two bit cells within a column can be active simultaneously. If both bit cells are being written to, this is not a problem. However, it is possible for one bit cell to be written to while the other is being read. In such a case, the bit cell that is being read may risk instability due to "read disturb", especially while the VDD is lowered. Thus, the pulse width of the write assist signal should be controlled and it is helpful to control it with respect to the word line pulse which is the pulse that is sent to the word lines 152 to turn the pass transistors on and enable the cell to be accessed.

Thus, during this read operation, the pulse from the write assist circuitry will lower the virtual voltage rail and the internal load of the read bit cell will start to become unstable. However, during this time the state stored inside this bit cell is developed onto the bit line and the complementary bit line of the column. So as long as the word line pulse width is longer than the write assist pulse width a write back operation will force the bit cell back to its original state and data will not be lost. Thus, this is a further constraint that may be followed to improve the stability of the cells when determining the timing and width of the pulses Another issue with a dual port memory cell is the potential speed degradation of a read to a different bit cell within a column that is being written to. This is caused by the fact that VDD is lowered and this therefore reduces the gate voltage to the pull down transistors within the bit cell. This penalty can be avoided or at least reduced if the write assist pulse is triggered some time after the rising edge of the word line.

This problem can also be addressed to some extent with the circuits of FIGS. 7 and 8 where the lowering of the voltage rail is limited using the feedback mechanism. This prevents the voltage level from falling too low, thereby increasing the stability of the cell and this allows the write assist pulse to be longer.

Figure 10:
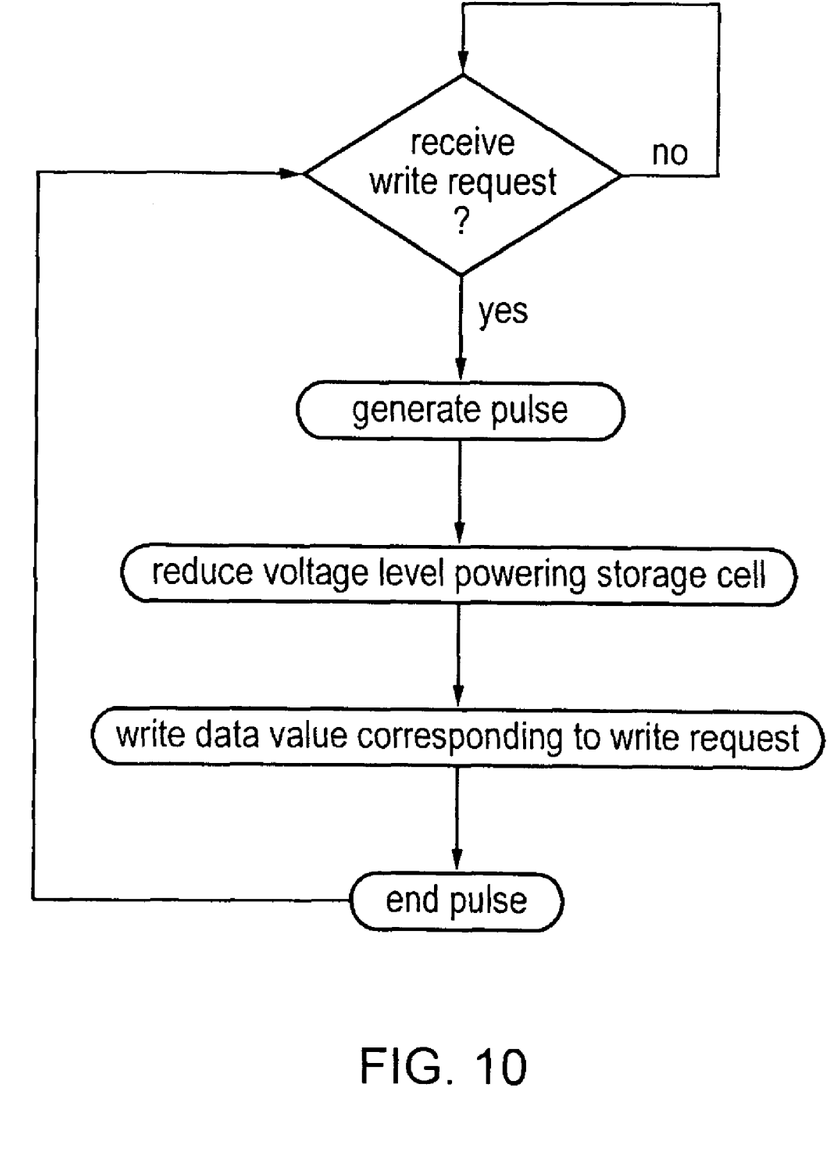
FIG. 10 shows a flow diagram illustrating steps in a method of writing to an SRAM cell according to an example embodiment.

FIG. 10 shows a flow diagram illustrating a method of storing data according to an example embodiment. Initially a feedback loop for storing a data value is powered with a higher voltage and a lower voltage, and the storage cell is in a stable retention state. The cell then receives a request to write a new data value to it. In order to be able to write this reliably to the cell a pulse signal is generated and in response to the pulse signal a reduced internal voltage level is provided for a period dependent on a width of the pulse signal. The reduced internal voltage level is lower than the high voltage level that powers the cell in a normal retention state. The data value is then stored in the storage cell that is rendered relatively unstable and thus, receptive to a new value by the reduced voltage level.

Although illustrative, example, and non-limiting embodiments have been described in detail herein with reference to the accompanying drawings, it is to be understood that the claims not limited to those example embodiments, and that various changes and modifications can be effected therein by one skilled in the art without departing from the scope and spirit of the claims.

I claim:

1. A data store comprising:
an input for receiving a data value;
at least one storage cell comprising:
a feedback loop for storing said data value;
an output for outputting said stored data value;
said feedback loop receiving a higher voltage and a lower voltage as power supply, said data store further comprising:
a voltage supply for powering said data store, said voltage supply outputting a high voltage level and a low voltage level;
write assist circuitry arranged between said voltage supply and said at least one storage cell, said write assist circuitry being responsive to a pulse signal to provide a discharge path between said high voltage level and a lower voltage level and thereby generate a reduced internal voltage level from said high voltage level for a period dependent on a width of said pulse signal, said reduced internal voltage level being lower than said high voltage level, such that when powered said feedback loop receives said reduced internal voltage level as said higher voltage for said period determined by said pulse width and said high voltage level at other times; and
pulse signal generation circuitry for generating said pulse signal in response to a write request sent to said at least one storage cell.

2. A data store according to claim 1, said write assist circuitry comprising a plurality of transistors arranged in series between said high voltage level and said low voltage level, said feedback loop receiving said higher voltage from a node between said plurality of transistors, said pulse generation circuitry being configured to supply said pulse signal to at least one gate of said plurality of transistors, such that in response to said pulse signal said corresponding at least one transistor changes state and said reduced internal voltage is output at said node and in response to no pulse signal substantially said high voltage level is output at said node.

3. A data store according to claim 1, wherein said write assist circuitry comprises a PMOS and NMOS transistor arranged in series between said high voltage supply and said low voltage supply, said feedback loop receiving said higher voltage from a node between said PMOS and NMOS transistors, said pulse generation circuitry being configured to supply said pulse signal to gates of said transistors, said PMOS transistor turning off and said NMOS transistor turning on in response to said pulse such that said higher voltage supplied to said feedback loops falls while said pulse is supplied to said gates.

4. A data store according to claim 1, wherein said storage cell comprises a standard latch cell, comprising a transmission gate and said feedback loop.

5. A data store according to claim 4, wherein said feedback loop comprises cross coupled inverters.

6. A data store according to claim 1, wherein said at least one storage cell comprises a six transistor bit cell.

7. A data store according to claim 1, wherein said pulse generation circuitry is configured to be programmable such that said width of said pulse can be varied in response to an input.

8. A data store according to claim 7, said pulse generation circuitry comprising an external input for receiving a signal indicative of said width of said pulse from a user.

9. A data store according to claim 1, wherein said pulse generation circuitry is configured to generate said width of said pulse in response to a plurality of predetermined conditions.

10. A data store according to claim 9, wherein said plurality of predetermined conditions comprise at least one of a loading of said data store, characteristics of said write assist circuitry, a required minimum higher voltage level.

11. A data store according to claim 1, wherein said write assist circuitry comprises a feedback loop such that in response to said reduced internal voltage level reaching a predetermined value said write assist circuitry does not reduce said voltage level further.

12. A data store according to claim 1, wherein said pulse generation circuitry is responsive to receipt of a write request to write said data value to said data store to generate said pulse.

13. A data store according to claim 1, comprising a plurality of said storage cells arranged in an array.

14. A data store according to claim 6, comprising a plurality of said storage cells arranged in an array and a plurality of write assist circuitry one for each column of said array, said data store comprising an SRAM memory.

15. A data store according to claim 14, wherein said SRAM comprises a dual port SRAM configured to receive two access requests during a same clock cycle, said data store comprising word line pulse generation circuitry for generating a word line pulse to activate a row of storage cells in said array in response to receipt of one of said access requests, said word line pulse generation circuitry and said pulse signal generation circuitry being configured such that said pulse generated by said pulse signal generation circuitry is narrower than said word line pulse.

16. A data store according to claim 15, wherein said word line generation circuitry is configured to generate said word line pulse before said pulse generation circuitry generates said pulse.

17. A data store according to claim 5, comprising a plurality of said storage cells arranged in a plurality of blocks and a plurality of write assist circuitry one for each block.

18. A data store according to claim 5, comprising a plurality of said storage cells arranged in a plurality of rows and a plurality of write assist circuitry one for each row.

19. A method of storing data comprising the steps of:
powering a feedback loop for storing said data value in at least one storage cell with a higher voltage and a lower voltage;
receiving a data value;
in response to receipt of said data value, generating a pulse signal
in response to said pulse signal, providing a discharge path between said high voltage level and a lower voltage level and thereby generating a reduced internal voltage level from a high voltage level supplied from a power supply for a period dependent on a width of said pulse signal, said reduced internal voltage level being lower than said high voltage level, such that when powered said feedback loop receives said reduced internal voltage level as said higher voltage for said period determined by a pulse width and said high voltage level at other times; and
storing said received data value in said storage cell during said pulse period.

20. A means for storing data comprising:
an input means for receiving a data value;
at least one storage means comprising:
a feedback loop for storing said data value;
an output means for outputting said stored data value;
said feedback loop receiving a higher voltage and a lower voltage as power supply, said data store further comprising:
a voltage supply means for powering said data store, said voltage supply outputting a high voltage level and a low voltage level;
write assist means arranged between said voltage supply means and said at least one storage means, said write assist means being responsive to a pulse signal to provide a discharge path between said high voltage level and a lower voltage level to generate a reduced internal voltage level from said high voltage level for a period dependent on a width of said pulse signal, said reduced internal voltage level being lower than said high voltage level, such that when powered said feedback loop receives said reduced internal voltage level as said higher voltage for said period determined by said pulse width and said high voltage level at other times; and
pulse signal generation means for generating said pulse signal in response to a write request sent to said at least one storage cell.

* * * * *